United States

Fujita

[11] 3,936,676

[45] Feb. 3, 1976

[54] MULTI-LEVEL VOLTAGE SUPPLY CIRCUIT FOR LIQUID CRYSTAL DISPLAY DEVICE

[75] Inventor: Minoru Fujita, Kodaira, Japan

[73] Assignee: Hitachi, Ltd., Japan

[22] Filed: Aug. 8, 1974

[21] Appl. No.: 495,788

[30] Foreign Application Priority Data
May 16, 1974  United Kingdom.............. 21904/74

[52] U.S. Cl. ............... 307/270; 307/205; 307/209; 307/296; 340/324 M; 340/336; 350/160 LC; 357/42

[51] Int. Cl.² ................. H03K 19/08; H03K 1/02; G02F 1/13; H01L 29/78

[58] Field of Search ....... 307/71, 80, 205, 209, 270, 307/251, 296; 58/50 R; 340/166 EL, 324 M, 336; 350/160 LC

[56] References Cited
UNITED STATES PATENTS

| | | | |
|---|---|---|---|
| 3,654,388 | 4/1972 | Slottow et al. ................. | 340/324 M |
| 3,787,834 | 1/1974 | Elliott........................... | 350/160 LC |
| 3,789,388 | 1/1974 | Medwin.............................. | 340/336 |
| 3,794,990 | 2/1974 | Kishimoto................. | 350/160 LC X |

Primary Examiner—John S. Heyman
Assistant Examiner—L. N. Anagnos
Attorney, Agent, or Firm—Craig & Antonelli

[57] ABSTRACT

A multi-level voltage supply for liquid crystal display devices employs complementary metal-oxide-semiconductor field-effect transistors. The supply circuit proper includes a p type and an n type MOSFET which are connected in series with each other. A plurality of n-type MOSFETs are grouped together in pairs with their source and gate electrodes connected together and being connected in parallel with the first-mentioned n-type MOSFET. A plurality of voltage levels are applied to the circuit, the lowest of which is applied to the first-mentioned n-type MOSFET. Intermediate voltage levels are applied to the plural parts of n-type MOSFETs. Multi-level voltages for driving the liquid crystal display devices are provided at the connection point of the P-type MOSFET and the N-type MOSFETs of the plurality. As a result, it is possible to prevent the flow of a D.C. current between the lowest level voltage source and the intermediate level voltage source.

8 Claims, 6 Drawing Figures ly MULTI-LEVEL VOLTAGE SUPPLY CIRCUIT FOR LIQUID CRYSTAL DISPLAY DEVICE

BACKGROUND OF THE INVENTION

Description of the Prior Art

In the design of driver circuits for a liquid crystal display device, the life of the liquid crystal is a major consideration. When a D.C. voltage is applied to the liquid crystal over a long period of time, the life of the liquid crystal is shortened. As a result, it has become general practice to apply a bidirectional drive to the liquid crystal, as described in an article by N. A. Luce, entitled "C/MOS Digital Wristwatch Features Liquid Crystal Display" on pages 93–97 in *Electronics*, Apr. 10, 1972. Through this technique, the polarity of the voltage applied across the electrode of the liquid crystal is periodically changed. Moreover, the periods of time for each respective polarity are symmetrical. In the liquid crystal drive circuit, a low frequency voltage is applied during the "on" state, while a high frequency voltage is applied during the "off" state.

Also employed are liquid crystal display devices which have visual threshold voltages (Vth) as described in an article entitled, "Deformation of Nematic Liquid Crystals with Vertical Orientation in Electrical Fields" by M. F. Schiekel and K. Fahrenschon in the *Applied Physics Letters*, Volume 19, Number 10, Nov. 15, 1971, page 391–398 and in the Japanese technical journal "Transistor gijitsu", August 1971, 104–109. In this type of device, the visual (optical) states are changed by controlling the voltage levels in dependence upon a threshold voltage. This type of display device drive is more suitable for dynamic indications than the above-described frequency drive device.

Examples of circuitry for driving liquid-crystal display devices by three-level voltage sources are described in U.S. patent application Ser. No. 419,348, entitled, "Driving System for Liquid Crystal Display Device" filed Nov. 27, 1973 by Y. Hatsukano and Application Ser. No. 419,442 entitled "Driving System for Liquid Crystal Display Device" filed Nov. 27, 1973 by Y. Hatsukano, each application being assigned to the assignee of the present application.

An example of a voltage supplying circuit for supplying multi-level voltages to liquid crystal display devices is described in Japanese Patent Application No. 38,728 (1974) in which complementary MOS circuits are employed for achieving low power consumption. The circuitry described in this application which employs only MOSFETs, however, has problems in that the threshold voltage of some of the MOSFETs becomes higher than that of other MOSFETs (the "substrate effect"), since the semiconductor well regions of some of the MOSFETs for supplying intermediate voltage levels are connected to a potential which differs from the voltage applied to the source electrodes.

In order to eliminate this undesirable "substrate effect", a circuit of the type shown in FIG. 1a of the drawings of the present application is proposed. In this circuit, a P-type MOSFET 1 is connected to each of a plurality of N-type MOSFETs 2, 3 and 4. MOSFET 1 constitutes part of a complementary MOSFET pair connected to the semiconductor substrate. A voltage level V1 (0 volts) is applied to the source electrode of MOSFET 1 and other voltage levels ($V2 = -20$ volts), ($V3 = -15$ volts), and ($V4 = -10$) are applied to the source electrodes of the n-type MOSFETs 2, 3 and 4, respectively. As can be seen from the above parametric values, the voltage level V1 is the highest voltage level, the voltage level V2 is the lowest voltage level and the voltage levels V3 and V4 are intermediate voltage levels.

In the circuitry of FIG. 1a, the respective regions of the MOSFETs would be formed as shown in FIG. 1b, which is a cross-sectional view of a substrate in which respective semiconductor regions have been formed to provide the schematic circuit shown in FIG. 1a. The source electrodes of the N-type MOSFETs 3 and 4, for supplying intermediate voltage levels, are connected to the respective well regions W2 and W3. As a result, the threshold voltages of MOSFETs 3 and 4 are not higher than the threshold voltages of MOSFETs 1 and 2, i.e. the so-called substrate effect is prevented. In this semiconductor device configuration, however, when MOSFET 2 is turned "on", current flows through the N-type drain regions D3 and D4, well regions W2 and W3 of MOSFETs 3 and 4, to the respective voltage terminals V3 and V4, as shown by the curved arrows in FIG. 1b. This current flow, moreover, causes an undesirable increase in power consumption.

In order to prevent the formation of these current paths, the source electrodes of MOSFETs 3 and 4 may be disconnected from the respective p-type well regions W2 and W3. With such a circuit configuration, however, since the well regions W2 and W3 are not electrically connected to any fixed potential, the potentials therein will become unstable. As a result, the threshold voltages of MOSFETs 3 and 4 are not constant during the operation of the circuit.

BRIEF SUMMARY OF THE INVENTION

In accordance with the present invention, a multi-level voltage supply circuit employs a P-type and an N-type MOSFET connected in series with one another. A plurality of N-type MOSFETs are connected in pairs and in parallel with the first-mentioned N-type MOSFET. The lowest voltage level employed is applied to the first-mentioned N-type MOSFET, while intermediate voltage levels are applied to the respective pairs of N-type MOSFETs. Through this configuration, multi-level voltages are provided at the connection point of the P-type MOSFET and the N-type MOSFETs.

Furthermore, the above-mentioned undesirable power consumption due to unwanted current flow does not occur and the threshold voltages supplied by the MOSFETs for supplying intermediate voltage levels remain constant during the operation of the circuit.

Moreover, it is possible to simplify the circuit design of the structure in integrated circuit form with respect to bias potentials and other thermal conditions.

The multi-level voltage supply circuit of the present invention is applicable especially to liquid crystal display devices which are employed in electronic wristwatches, small-sized electronic desktop calculators, and in general, circuits requiring multi-level voltage supply sources.

DETAILED DESCRIPTION OF THE EMBODIMENTS

Figure 1A:
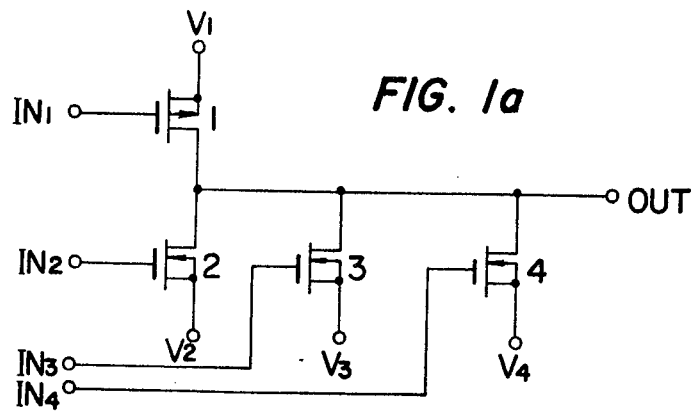
FIGS. 1a and 1b depict a multi-level voltage supply circuit in schematic form and in its cross-sectional semiconductor structure, respectively.
Figure 1B:
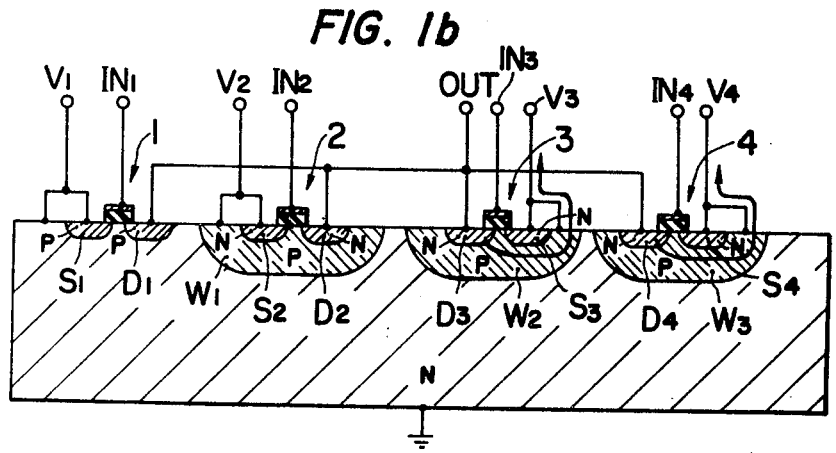
Figure 2A:
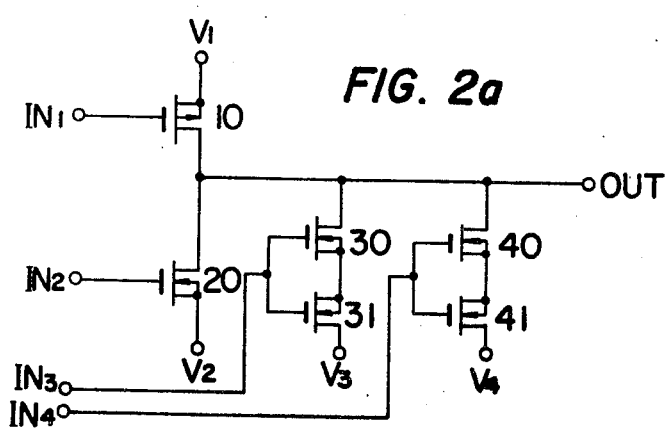
FIGS 2a and 2b depict a preferred embodiment of the multi-level supply source of the invention in schematic and in its semiconductor cross-sectional form, respectively.
Figure 2B:
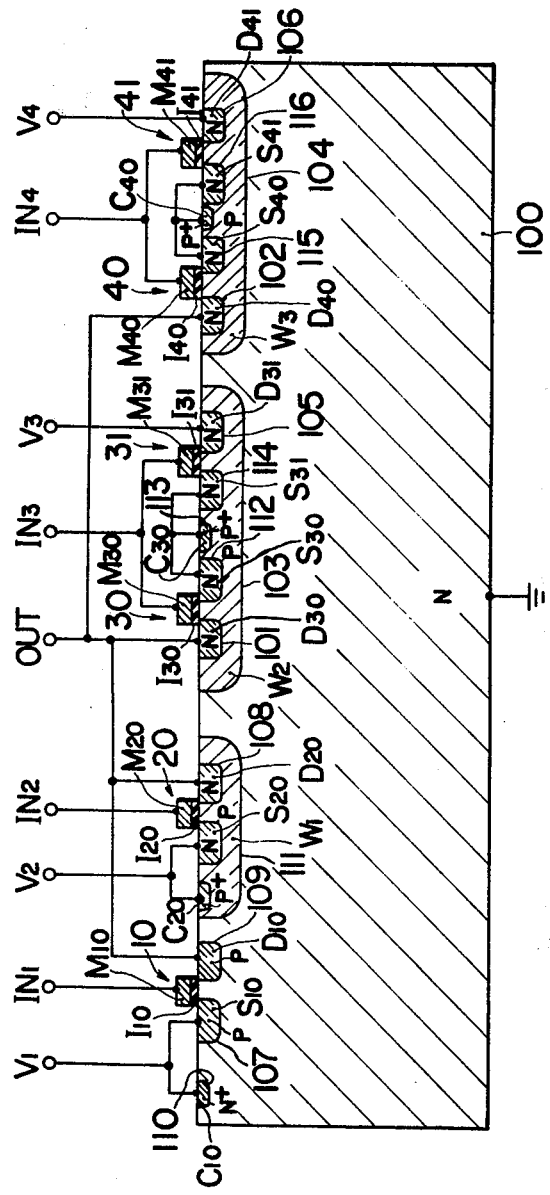

With reference to FIGS. 2a and 2b of the drawings of the present application, a p-channel MOSFET 10 and an n-channel MOSFET 20 are connected in series between voltage supply terminals V1 and V2. To the gate electrodes of these transistors are applied input voltage $IN_1$ and $IN_2$, respectively. Connected to the common connection point of transistors 10 and 20 are a plurality of pairs of MOSFETs 30–31 and 40–41. The source electrodes of transistors 30 and 40 are connected to bias voltage sources V3 and V4 through MOSFETs 31 and 41, respectively. The source and gate electrodes of MOSFETs 30 and 31 and the source and gate electrodes of MOSFETs 40 and 41 are connected in common, respectively. The drain-substrate junctions (backward-biased junctions) of MOSFETs 31 and 41 prevent the formation of a D.C. current path which would otherwise exist between sources V2 and V3 and between sources V2 and V4, respectively. The output voltage is derived at terminal OUT.

As is shown in FIG. 2b, an N-type silicon substrate 100, having a resistivity of 1 to 2Ωcm has a plurality of P-type well regions W1, W2 and W3 diffused to a depth of about 8 microns by conventional selective diffusion techniques, simultaneously. The surface impurity concentration of these regions is about $5 \times 10^{16}$ /cm$^2$.

Then, N-type source and drain regions are diffused into the well regions to form the source and drain regions of MOSFETs 20, 30, 31, 40 and 41, simultaneously. These diffused source and drain regions extend to a depth of about 1.5 microns into the well regions and have a surface impurity concentration of about $10^{20}$ atoms/cm$^2$.

Next, P$^+$ type contact regions $C_{20}$, $C_{30}$ and $C_{40}$ are simultaneously selectively diffused into the well regions. The surface impurity concentrations of these regions are higher than those of the N-type source and drain regions of MOSFETs 20, 30, 31, 40 and 41.

The sources $S_{30}$ and $S_{31}$ of MOSFETs 30 and 31, as well as the sources $S_{40}$ and $S_{41}$, of MOSFETs 40 and 41 may be formed as continuous diffused regions, respectively, since they are respectively interconnected with each other and to contact regions $C_{30}$ and $C_{40}$, respectively.

Regions 107 and 109 are diffused into the substrate to form P-type source and drain regions of the transistor 10, the source and drain regions being spaced apart from one another by about 8 to 15 microns and having a depth of about 1.5 microns into the substrate proper. An N$^+$ type impurity concentration region 110 for forming contact region $C_{10}$ is diffused to a depth of about 1 micron into the substrate and has a surface impurity concentration of about $10^{21}$ atoms/cm$^2$.

Overlying the respective gate regions of the transistors are layers of insulating material $I_{10}$, $I_{20}$, $I_{30}$, $I_{31}$, $I_{40}$ and $I_{41}$ having a thickness of about 1200 A. Silicon gate electrode layers, to which input voltages are applied $M_{10}$, $M_{20}$, $M_{30}$, $M_{31}$, $M_{40}$, and $M_{41}$ are respectively formed on these insulating layers to a thickness of about 4,000 A. When aluminum is employed for the gate electrode layers $M_{10}$, $M_{20}$, $M_{30}$, $M_{31}$, $M_{40}$ and $M_{41}$ are respectively formed on the insulating layers to a thickness of about 10,000 A.

For simplifying the operational explanation, the substrate may be grounded, as shown in FIG. 2b.

Now, when MOSFET 20 is turned "on", as the result of the application of a voltage to input terminal $IN_2$, the lowest voltage level V2, which is applied to the source $S_{20}$, is also applied to the well regions W2 and W3 through the forward-biased junctions between drain region $D_{30}$ and well region W2 and between drain region $D_{40}$ and well region W3.

On the other hand, intermediate voltage levels V3 and V4 which are higher than the voltage level V2 are applied to the drain regions $D_{31}$ and $D_{41}$, respectively. As a result, the drain-well region junctions of MOSFETs 31 and 40 are reverse-biased. Therefore, a D.C. current path is not provided between the voltage source V2 and the other voltage sources V3 or V4. Because of the prevention of these current paths, power consumption is reduced, so that the overall power consumption of the circuit is lowered.

Furthermore, since the well regions W2 and W3 are connected to source regions $S_{30}$ and $S_{31}$ and to source regions $S_{40}$ and $S_{41}$, respectively, a change or variation in the threshold voltage is prevented.

Figure 3:
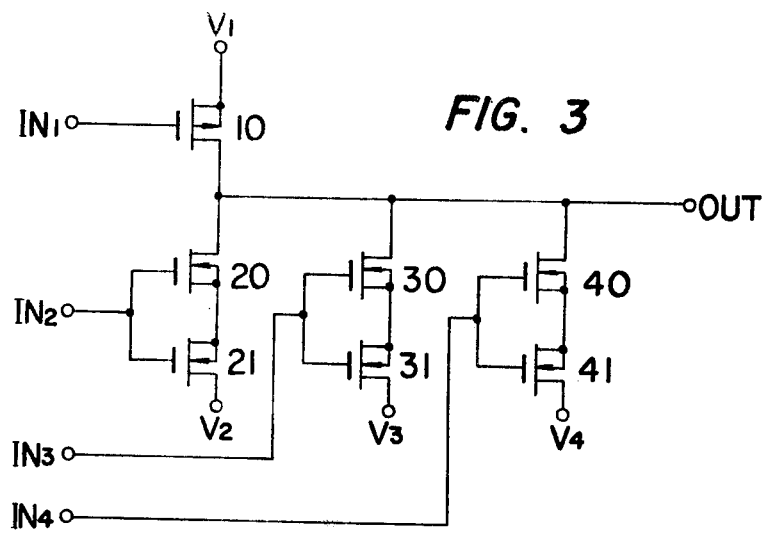
FIG. 3 illustrates a schematic representation of a modification of the invention depicted in FIG. 2.

In place of a single MOSFET 20, as shown in FIG. 2a, a pair of MOSFETs 20 and 21 may be interconnected to each other as shown in FIG. 3. In this case, the lowest and the intermediate voltage levels are supplied to the drain electrodes of MOSFETs 21, 31 and 41 in any desired fashion.

Furthermore, the conductivity types of the MOSFETs are not necessarily limited to those described above, but may be reversed, with appropriate changes in the polarity of the voltage sources.

Figure 4:
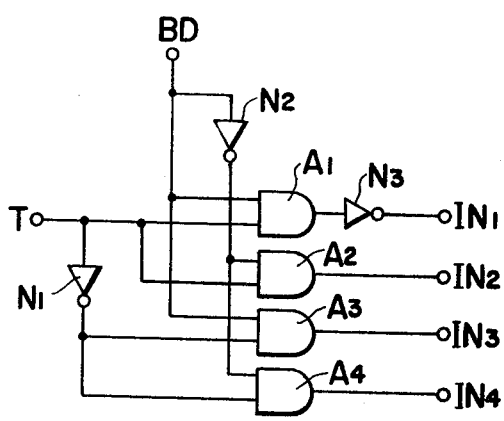
FIG. 4 illustrates a logic circuit for producing the input voltages suitable for application to the multi-level supply circuit of the present invention.

FIG. 4 depicts a logic circuit for generating the input voltages $IN_1 - IN_4$ applied to the gate electrodes of the MOSFETs shown in FIGS. 2a and 3, as described above.

A digit timing signal is applied to input terminal T, which is connected to AND gates $A_1$ and $A_2$ and to inverter $N_1$. A pulse signal, such as a bidirectional liquid crystal drive pulse signal, for driving a liquid crystal bidirectionally, is applied at terminal BD, which is connected to inverter $N_2$ and to AND gates $A_3$ and $A_4$.

One of the input terminals $IN_1$ –$IN_4$ of the multi-level voltage circuit is selected by the appropriate logic combination between the bidirectional liquid crystal drive pulse BD and the digit timing signal T as shown in Table I.

TABLE I

| T | BD | Selected Input Terminal |
|---|----|-------------------------|
| "1" | "0" | $IN_2$ |
| "1" | "1" | $IN_1$ |
| "0" | "1" | $IN_3$ |
| "0" | "0" | $IN_4$ |

In the Table, "1" designates a positive potential, while "0" designates a zero or ground potential.

Now considering the outputs $IN_1$–$IN_4$ of the logic circuit of FIG. 4 connected to the restrictive terminals $IN_1$–$IN_4$ of FIG. 2a, when a "0" input signal is applied to MOSFET 10, to turn the same "on", by way of input terminal $IN_1$, a voltage V1 (zero volts) will be derived at the output terminal OUT, since MOSFET 10 has been rendered conductive.

When a "1" level is supplied to the input terminal $IN_2$ of MOSFET 20, MOSFET 20 will be turned "on" and a voltage level V2 (−20 volts) will be supplied at the output terminal OUT. When MOSFET 20 is turned "on", the voltage level V2 will also be applied to the P-type well regions W2 and W3 through the forward-biased junctions 101 and 103 between N-type drain $D_{30}$ and P-type well region W2 and between N-type drain region $D_{40}$ and P-type well region W3 as shown in FIG. 2b. On the other hand, since the voltage level V3 (−15 volts) and the voltage level V4 (−10 volts) are applied to drain regions $D_{31}$ and $D_{41}$, junctions 105 and 106 will be reverse-biased. As a result, a D.C. current does not flow between voltage terminal V2 (−20 volts) and voltage terminal V3 (−15 volts) of voltage terminal V4 (−10 volts).

When a "1" logical input signal is applied to terminal $IN_3$, to turn MOSFETs 30 and 31 "on", the voltage level of V3 (−15 volts) will appear at output terminal OUT. This voltage level V3 will also be applied to drain regions $D_{10}$, $D_{20}$ and $D_{40}$. However, junction 109 between the P-type drain region $D_{10}$ and the substrate 100 will be reverse-biased. Thus, a D.C. current will not flow to the substrate by way of drain region $D_{10}$.

Moreover, junction 108 between the N-type drain region $D_{20}$ and the P-type well region W1 is reverse-biased. Yet, junction 102 between the N-type drain region $D_{40}$ and the P-type well region W3 is forward-biased. However, since the junction 106 between the N-type drain region $D_{41}$ and the P-type well region W3 is reverse-biased, a D.C. current does not flow between terminals V3 and V4.

Now, when an input signal is applied to MOSFETs 40 and 41 to turn the same "on", by way of input terminal $IN_4$, a voltage level V4 (−10 volts) will appear at the output terminal OUT. This voltage level V4 is also applied to the drain regions $D_{10}$, $D_{20}$ and $D_{30}$. Yet, since the junctions 109, 108 and 101 are reverse-biased, a D.C. current will not flow between the terminal V4 and the other sources V1, V2 and V3.

As a result of the improved configuration of the present invention, undesirable D.C. current flow does not occur, thereby significantly reducing power consumption. For the application of the present invention to driving a liquid crystal display device, similar voltage levels are supplied to the segment sides of the display. One segment of the crystal display is indicated when the voltage difference between the digit and the segment electrodes becomes around 20 volts. Thus, it will be seen that the present invention is suitable for such purposes, yet permits a low amount of power consumption during the operation of the circuit.

While I have shown embodiments in accordance with the present invention it is understood that the same is not limited thereto but is susceptible of numerous changes and modifications known to a person skilled in the art and I therefore do not wish to be limited to the details shown and described herein but intend to cover all such changes and modifications as are obvious to one of ordinary skill in the art.

What is claimed is:

1. A voltage supply circuit comprising:
    first and second switching means each of said first and second switching means having an input electrode, an output electrode, and a control electrode, the input and output electrodes of said first and second switching means being connected in series between first and second voltage sources;
    at least one pair of field-effect transistors, the source and substrate regions of which are respectively connected in common, and the gate electrodes of which are connected together;
    first means for connecting the drain region of one of said field-effect transistors to a common connection of said first and second switching means;
    second means for connecting the drain region of the other of said field-effect transistors to a third voltage source, the voltage level of which lies between the voltage levels of said first and second voltage sources;
    third means for deriving an output voltage from the common connection of said first and second switching means and;
    fourth means for applying input voltages respectively to the control electrodes of said first and second switching means and to the gate electrodes of said at least one pair of field-effect transistors, whereby said output voltage will have a voltage level corresponding to the level of one of said first through third voltage sources.

2. A voltage supply circuit as defined in claim 1, wherein said first and second switching means respectively comprise third and fourth insulated gate field-effect transistors, the conductivity types of which are opposite one another.

3. A voltage supply circuit as defined in claim 2, wherein each transistor of said at least one pair of field-effect transistors has the same conductivity type as said field-effect fourth transistor.

4. A voltage supply circuit as defined in claim 2, wherein the source and substrate of each of said third and fourth field-effect transistors are respectively connected together and the drains of said third and fourth field-effect transistors are connected in common to said third means.

5. A voltage supply circuit as defined in claim 1, wherein said first switching means comprises a third field-effect transistor and said second switching means comprises a pair of fourth and fifth field-effect transistors, the conductivity type of said third transistor being opposite to that of said fourth and fifth transistors, the source and substrate of each of said third, fourth and fifth transistors being respectively connected together, the source of said fourth and fifth transistors being connected together, the drain of said fourth transistor being connected to the drain of said third transistor, and the drain of said fifth transistor being connected to said second voltage source, while the source of said third transistor is connected to said first voltage source.

6. A voltage supply circuit as defined in claim 5, wherein each transistor of said at least one pair of field-effect transistors has the same conductivity type as said fourth transistor.

7. A voltage supply circuit as defined in claim 3, wherein said at least one pair of field-effect transistors comprises plural pairs of field-effect transistors, each of which has a gate electrode, a drain region, and a source region, the drain regions of one of the field-effect transistors of each of said plural pairs being connected to the common connection of said third and fourth insulated gate field-effect transistors, the drain regions of the other of the field-effect transistors of each of said plural pairs being connected to a respectively different source of voltage the level of which lies between the voltage levels of said first and second voltage sources, and wherein said fourth means includes means for applying respective control signals to the respective connected-together electrodes of said plural pairs of field-effect transistors.

8. A voltage supply circuit as defined in claim 6, wherein said at least one pair of field-effect transistors comprises plural pairs of field-effect transistors, each of which has a gate electrode, a drain region, and a source region, the drain regions of one of the field-effect transistors of each of said plural pairs being connected to the common connection of said third and fourth insulated gate field-effect transistors, the drain regions of the other of the field-effect transistors of each of said plural pairs being connected to a respectively different source of voltage the level of which lies between the voltage levels of said first and second voltage sources, and wherein said fourth means includes means for applying respective control signals to the respective connected-together electrodes of said plural pairs of field-effect transistors.

* * * * *